United States Patent [19]
Gorrie et al.

[11] Patent Number: 5,214,796
[45] Date of Patent: May 25, 1993

[54] IMAGE SEPARATION MIXER

[75] Inventors: Gregory J. Gorrie; Warren L. Seely; Joseph Staudinger, all of Chandler, Ariz.

[73] Assignee: Motorola, Inc., Schaumburg, Ill.

[21] Appl. No.: 677,688

[22] Filed: Mar. 29, 1991

[51] Int. Cl.$^5$ ............................................. H04B 1/26
[52] U.S. Cl. ..................................... 455/326; 455/330; 455/302
[58] Field of Search ............... 455/326, 330, 302, 303, 455/304, 305, 306, 317, 318, 313; 307/529, 321; 328/162, 165

[56] References Cited

U.S. PATENT DOCUMENTS

| | | | |
|---|---|---|---|
| 3,575,660 | 4/1971 | Jorgensen | 325/388 |
| 3,757,258 | 9/1973 | Dillman et al. | 333/73 |
| 3,805,163 | 4/1974 | Hara et al. | 325/437 |
| 4,352,071 | 9/1982 | Childs et al. | 329/105 |
| 4,367,560 | 1/1983 | Hallford | 455/330 |
| 4,457,022 | 6/1984 | Dydyk | 455/317 |
| 4,584,715 | 4/1986 | Baars et al. | 455/302 |
| 4,662,001 | 4/1987 | Cruz et al. | 455/340 |
| 4,696,055 | 9/1987 | Marshall | 455/118 |
| 4,723,317 | 2/1988 | Glance | 455/619 |
| 4,731,875 | 3/1988 | Mizukami et al. | 455/302 |
| 4,801,900 | 1/1989 | Mower | 332/45 |
| 4,896,374 | 1/1990 | Waugh et al. | 455/326 |
| 4,955,079 | 9/1990 | Connerney et al. | 455/325 |

OTHER PUBLICATIONS

Hallford; Trace Phase States to Check Mixer Designs; Microwaves, Jun. 1980, pp. 52-60.

Primary Examiner—Reinhard J. Eisenzopf
Assistant Examiner—Philip Sobutka
Attorney, Agent, or Firm—Robert M. Handy

[57] ABSTRACT

A mixer (50) separates IF components IF1, IF2 of the same frequency which are images of different frequency RF signals RF1, RF2 beating with a given LO signal, by combining a 180° phase shift input (56) for the LO signal (53) and a 90° phase shift input (66) for the RF signals (63) which are coupled to opposed ports (N1/N2; N3/N4) of a four port diode ring (70) and an output four port quadrature phase shifter (80). The diode ring (70) generates IF signals (71, 72) which are fed to opposed input ports (75, 76) of the output phase shifter (80) at whose other ports (81, 82) the separated image signals IF1, IF2 appear.

20 Claims, 2 Drawing Sheets

IMAGE SEPARATION MIXER

FIELD OF THE INVENTION

The present invention concerns an improved means and method for mixing a modulated signal with a local oscillator signal.

BACKGROUND OF THE INVENTION

It is commonplace in the electronic art to combine a modulated signal with a local oscillator signal in order to obtain a further modulated signal at another frequency that is more easily amplified and detected. This is done in a mixer.

In a typical application, a modulated radio frequency (RF) signal is combined in a mixer with a local oscillator (LO) signal to produce an intermediate frequency (IF) signal which may be then further amplified and detected to recover the information modulated onto the RF carrier. The mixing process produces sum and differences of the RF and LO frequencies. One or more of the sum and difference frequencies is at the desired IF frequency, according to the following relations:

$$f_{IF} = f_{LO} - f_{RF}, \text{ i.e., down-conversion where } f_{LO} > f_{RF}, \quad (1)$$

$$f_{IF} = f_{RF} - f_{LO}, \text{ i.e., down conversion where } f_{LO} < f_{RF}, \quad (2)$$

$$f_{IF} = f_{LO} + f_{RF}, \text{ i.e. up conversion.} \quad (3)$$

Examination of equations (1) and (2) shows that there is not a unique correspondence between $f_{LO}$, $f_{IF}$ and $f_{RF}$. For a given value of $f_{LO}$, two different values of $f_{RF}$ may produce the same value of $f_{IF}$. For example, (see FIG. 1) for $f_{LO} = 3$ GigaHertz, both $f_{RF1} = 2.5$ GigaHertz and $f_{RF2} = 3.5$ GigaHertz can produce $f_{IF} = 0.5$ GigaHertz. The RF and IF frequencies are generally not discrete frequencies but narrow bands of frequencies determined by the modulation thereon.

While the IF signals resulting from RF1 and RF2 have same frequency, they may have different phase and carry different information. Thus, the IF signal may be thought of as having two components IF1, IF2 corresponding to two RF signals RF1, RF2, respectively. It is commonplace in the art to refer to one of the related signal pairs, e.g., RF1, IF1, as the "signal" and the other e.g., RF2, IF2, as the "image". The designations of RF1, IF1, as the "signal" and RF2, IF2 as the "image" are merely for convenience and may be interchanged. As used herein, the word "image" is intended to refer to IF1, IF2 collectively.

Mixers are often classified as "single balanced", "double balanced", "image rejection" and "image separation", depending upon their configuration and whether or not they separate the RF images at the IF. Of particular interest are image separation mixers, that is, mixers that provide separate outputs for IF1 and IF2.

A prior art image separation mixer is illustrated in FIG. 2. Mixer 10 has input 12 where, for example, RF input signal 14 comprising either or both RF1 and RF2 enters. Quadrature phase shifter 16 splits incoming signal 14 into two substantially equal amplitude RF signals 18, 20 which have a relative phase displacement of 90°. Signal 18 is fed to three port mixer 19 and signal 20 is fed to three port mixer 21.

In FIG. 2, phase shifters are shown as a square with an inscribed diamond whose sides represent different paths between the ports of the phase shifter. The number adjacent each path identifies the relative phase shift along that path. For example, as signal 14 passes through the "0" path of phase shifter 16 to become signal 18 it undergoes a relative phase shift of 0° and as signal 14 passes through the "90" path of shifter 16 to become signal 20 it undergoes a relative phase shift of +90°, with the result that signals 18 and 20 have a net or relative phase difference of 90°. Those of skill in the art will understand that the phase shift amounts indicated on the phase shift symbols are relative phase shift amounts and not absolute phase shift amounts. This same convention is used in connection with FIGS. 2-5. Where a four-port shifter is used, it is conventional to couple the "isolation" port, e.g., port 17, to ground via resistor 23 as shown in FIG. 2.

Mixer 10 has input port 22 where, for example, LO signal 24 is provided. Zero relative phase shift power splitter 26 receives signal 24 and produces two substantially equal amplitude zero phase difference signals 28, 30 respectively. In-phase LO signals 28, 30 are fed to mixers 19, 21 where they are mixed with RF signals 18, 20, respectively to produce IF signals 32, 33 at their outputs. Input signals 14 and 24 may be interchanged, that is, the RF signal may be introduced at input 22 and the LO signal may be introduced at input 12. The operation of the circuit is substantially the same.

Intermediate frequency signals 32, 33 from mixers 19, 21 are applied to quadrature phase shifter 34 where they combine in such a way that RF signals RF1, RF2 produce IF signals IF1, IF2 separated at outputs 36, 38 respectively. Separation of the RF1, RF2 signals into IF1, IF2 signals occurs because the relative phase $\phi$ of the signals is different according to the relations:

$$\phi_{IF1} = \phi_{LO} - \phi_{RF1}, \quad (4)$$

$$\phi_{IF2} = \phi_{RF2} - \phi_{LO}, \quad (5)$$

where $\phi_{RF}$ is the relative phase of the received signal at the RF frequency that may correspond to RF1 or RF2, $\phi_{LO}$ is the relative phase of the LO frequency, $\phi_{IF1}$ is the relative phase of the output at the IF frequency produced by signal RF1 below LO, and $\phi_{IF2}$ is the relative phase of the output at the IF frequency produced by signal RF2 above LO. Equations (4)-(5) and the identification of the relative phase of the various signals are explained, for example, in B. J. Hallford, "Trace Phase States to Check Mixer Designs", *Microwaves*, June 1980, pages 52-60.

FIG. 3 illustrates typical prior art three port mixer 40 used to provide mixers 19, 21 of the circuit of FIG. 2. Mixer 40 has has LO (or RF) input port 42 feeding into 180° phase shifter 44 with isolation port 45 used for IF extraction and RF (or LO) input port 46 feeding into 180° phase shifter 48 with isolation port resistive termination 47. The outputs from phase shifters 44, 48 are coupled to diode mixer ring 51. Mixers 19, 21 in prior art image separation mixer 10 each correspond to mixer 40 of FIG. 3.

Prior art image separation mixers have a number of disadvantages well known in the art. Among these disadvantages are, for example, their relative complexity and the difficulty often encountered of implementing them in a compact form suitable for incorporation in monolithic microwave integrated circuits (MMIC's).

MMIC's are typically implemented using silicon, GaAs or other III-v integrated circuit (IC) wafer processing technology on and/or in such wafers. Thus, it is highly desirable to have image separation mixers which can be made with lumped elements or other structures that are compatible with IC fabrication techniques and geometry. In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC. Such concerns are especially important in the frequency range from about 1 to 15 GigaHertz where the size of distributed circuit elements is unwieldy.

Thus, there continues to be a need for improved image separation mixers and methods that use few components, are easy to construct and/or which employ elements that are readily integratable in and/or on MMIC's or the like.

SUMMARY OF THE INVENTION

The present invention provides an improved means and method for an image separation mixer comprising, in its broadest form, first phase shift means for receiving a first input signal of at least a first frequency and providing second and third output signals of substantially equal amplitude and having a phase difference of substantially ninety degrees, second phase shift means for receiving a fourth input signal of at least a second frequency and providing fifth and sixth output signals of substantially equal amplitude and having a phase difference of substantially one hundred and eighty degrees, single four port mixer means for mixing the output signals from the first and second phase shift means to provide seventh and eighth signals of a third frequency derived from the first and second frequencies, and quadrature third phase shift means coupled to the mixer means for receiving the seventh and eighth signals and providing ninth and tenth output signals IF1, IF2 corresponding, respectively, to separated third and fourth frequencies RF1, RF2 forming the first signal or the fourth signal.

It is desirable but not essential that the mixer means comprises a balanced mixer element. A four port diode ring mixer element is preferred. The second phase shift means is conveniently formed from a balun but other phase shift means may also be used.

It is desirable but not essential to also provide a filter means coupling the mixer means to the quadrature phase shift means, which has a pass band including the third frequency and a stop band including at least the first or fourth frequencies or both. The filter desirably comprises a first filter means for passing the seventh signal and a second filter means for passing the eighth signal. The filter means desirably pass the IF signals and block the RF and LO signals.

The mixer desirably has at least one DC current path coupled between a port of the mixer means and ground, and preferably first and second DC current paths coupled between ground and opposed ports of the mixer means.

Improved IF image separation of an RF signal comprising first and second RF frequencies RF1, RF2 respectively, is provided by a method comprising, coupling a LO (or the RF) signal to a first phase shift means which provides substantially equal amplitude LO (or RF) signal outputs differing in phase by substantially 180°, coupling the RF (or a LO) signal to a second phase shift means having substantially equal amplitude RF (or LO) signal outputs differing in phase by substantially 90°, supplying the output signals of the first phase shift means to first opposed ports of a four port mixer element, supplying the output signals of the second phase shift means to second opposed ports of the four port mixer element, coupling IF signals appearing at opposed ports of the four port mixer element to input first and second ports of a four port quadrature phase shift means thereby obtaining at output third and fourth ports thereof separated IF signals IF1, IF2 corresponding to RF1, RF2, respectively.

It is desirable that the supplying steps comprise supplying balanced signals to a mixer element, conveniently but not essentially a balanced mixer element, and preferably a four port diode ring mixer element.

It is desirable but not essential that the method further comprise coupling the IF signals from the mixer element to the quadrature phase shift means through filters which have pass bands including the IF frequency and stop bands including the RF or LO frequencies or both.

The supplying or coupling steps desirably comprise providing at least one DC current path coupled between a port of the mixer element and ground, and preferably first and second DC current paths coupled between ground and opposed ports of the mixer element.

DETAILED DESCRIPTION OF THE DRAWINGS

Figure 4:
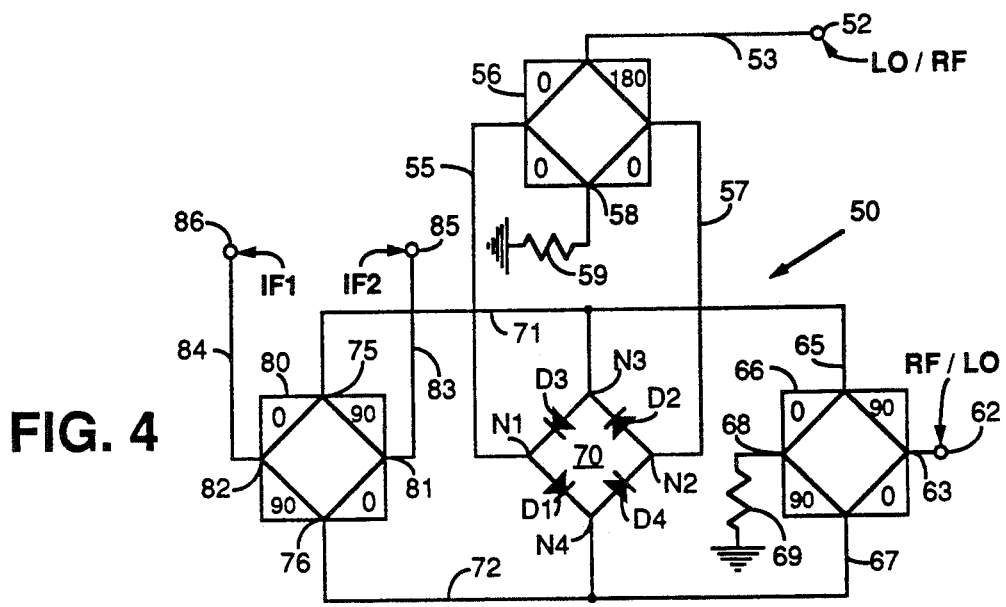
FIG. 4 is a simplified schematic representation of an image separation mixer apparatus, according to a preferred embodiment of the present invention.

Referring now to FIG. 4, image separation mixer apparatus 50, according to a preferred embodiment of the present invention, has LO (or RF) input port 52 and RF (or LO) input port 62. For convenience of explanation, the circuit is described for the preferred case of port 52 receiving the LO signal and port 62 receiving the RF signal, but the signals may be interchanged and the apparatus will function in substantially the same way except for local oscillator amplitude modulation noise cancellation.

LO signal 53 is coupled from input port 52 to phase shift means 56 which provides substantially equal amplitude output LO signals 55, 57 differing in phase by substantially 180°. Where phase shift means 56 is a four port element, then isolation port 58 is conveniently tied to ground via impedance 59, e.g., a resistor. RF signal 63 is coupled from input port 62 to phase shift means 66 which provides substantially equal amplitude output RF signals 65, 67 differing in phase by substantially 90°. Where phase shift means 66 is a four port element, then isolation port 68 is conveniently tied to ground via impedance 69, e.g., a resistor.

Output signal pairs 55, 57 are coupled to opposed ports N1, N2 of four port mixer element 70 and output signal pairs 65, 67 are coupled to opposed ports N3, N4 of four port mixer element 70. Four port mixer element 70 is desirably a balanced mixer element, conveniently a double balanced mixer element and preferably a ring mixer element comprising non-linear elements D1, D2, D3, D4, as for example, semiconductor diodes. Elements D1–D4 may be oriented in either direction, e.g., positive conduction counter clockwise (as shown) or positive conduction clock-wise. While elements D1–D4 are shown as being two-port elements (which are preferred), as for examples diodes, those of skill in the art will understand that any non-linear conduction element can be used and the words "diode" or "mixer element" or "mixer means", whether singular or plural, are intended herein to refer to any non-linear element or collection of elements capable of mixing signals.

Due to the non-linear conduction properties of diodes D1–D4, the RF and LO signals are mixed and the resulting IF signals appear at nodes N1, N2 and N3, N4 of mixer element 70. IF signals 71 and 72 are conveniently obtained between opposed nodes N3, N4 and coupled to input ports 75, 76 of quadrature phase shift means 80. Quadrature phase shift means 80 has output ports 81, 82 at which appear output signals 83, 84 which have undergone a relative phase shift of 90° with respect to the signals arriving at input ports 75, 76, according to the relative phase shift amounts ("0", "90") shown within phase shifter 80, as has been previously explained.

Output signals 84, 83 are coupled to output ports 86, 85 of mixer apparatus 50. Output signals 84, 83 correspond to separated IF images IF1 and IF2 derived from input RF signals RF1 and RF2, respectively. That is, substantially all of image IF1 appears at ports 82,86 and substantially all of image IF2 appears at ports 81,85.

The means by which this is accomplished may be better understood by reference to Phase Analysis Table I below which shows the relative phase of the various signals within mixing apparatus 50, according to equations (4)–(5) and the convention of Hallford, supra.

TABLE I

| PHASE ANALYSIS | | | | |
|---|---|---|---|---|
| REF. NODE<br>DIODE | N3<br>D2 | N3<br>D3 | N4<br>D1 | N4<br>D4 |
| $\phi_{RF1}$ | +90 | +90 | 0 | 0 |
| $\phi_{RF2}$ | +90 | +90 | 0 | 0 |
| $\phi_{LO}$ | 180 | 0 | 0 | 180 |
| $\Delta\phi_D$ | 0 | 180 | 0 | 180 |
| $\phi_{IF1}''$ @ mixer | +90 | −90 | 0 | 180 |
| $\phi_{IF2}''$ @ mixer | −90 | +90 | 0 | 180 |
| $\phi_{IF1}' = \phi_{IF1}'' + \Delta\phi_D$ | +90 | +90 | 0 | 0 |
| $\phi_{IF2}' = \phi_{IF2}'' + \Delta\phi_D$ | −90 | −90 | 0 | 0 |

$\phi_{IF1}''$, $\phi_{IF2}''$ identify $\phi_{IF1}$, $\phi_{IF2}$ components respectively as they appear at mixer element 70. $\phi_{IF1}'$, $\phi_{IF2}'$ identify $\phi_{IF1}$, $\phi_{IF2}$ components after the diode phase shift $\Delta\phi_D$ is included.

Figure 1:
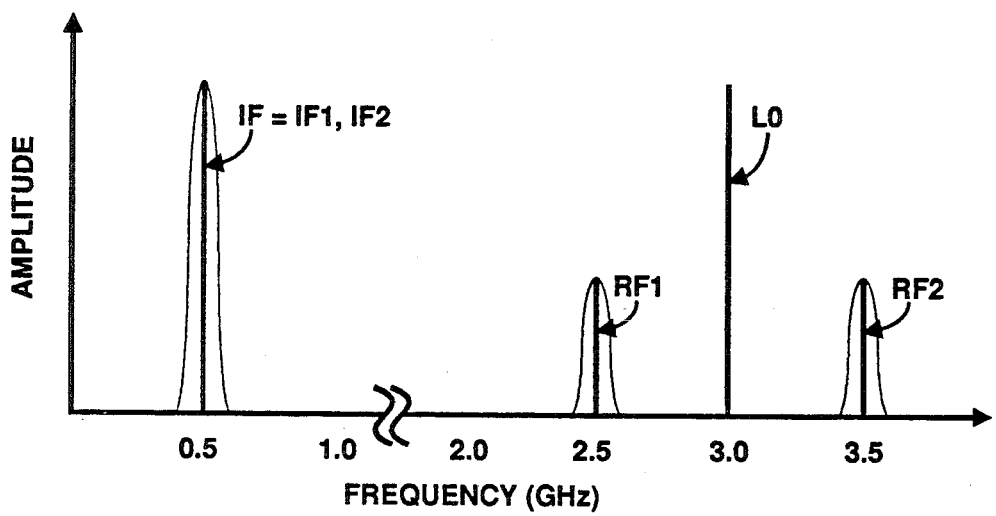
FIG. 1 is a simplified representation of RF, LO and IF signals of different frequencies showing how RF signals RF1, RF2 produce IF images IF1, IF2.
Figure 2:
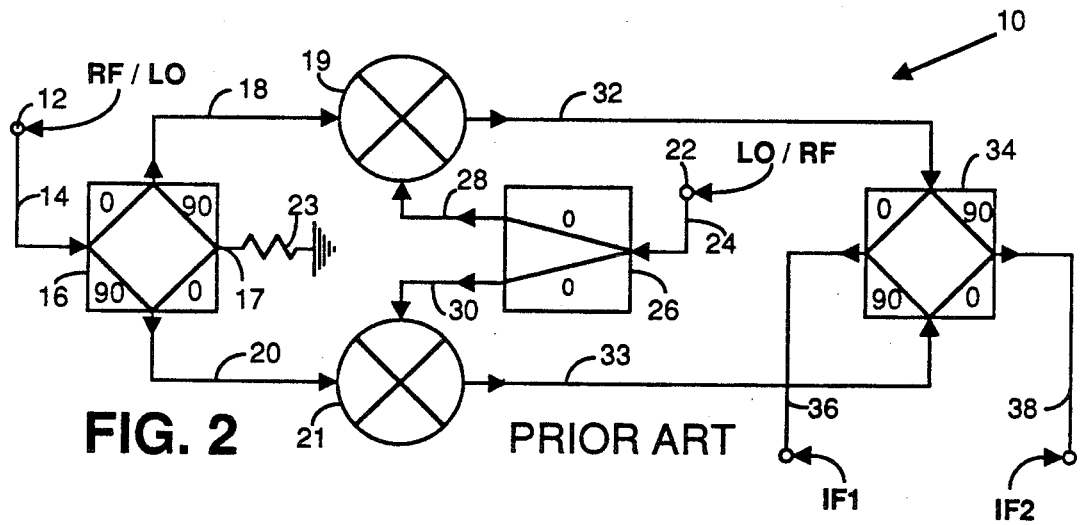
FIG. 2 is a simplified schematic representation of an image separation mixer apparatus, according to the prior art.
Figure 3:
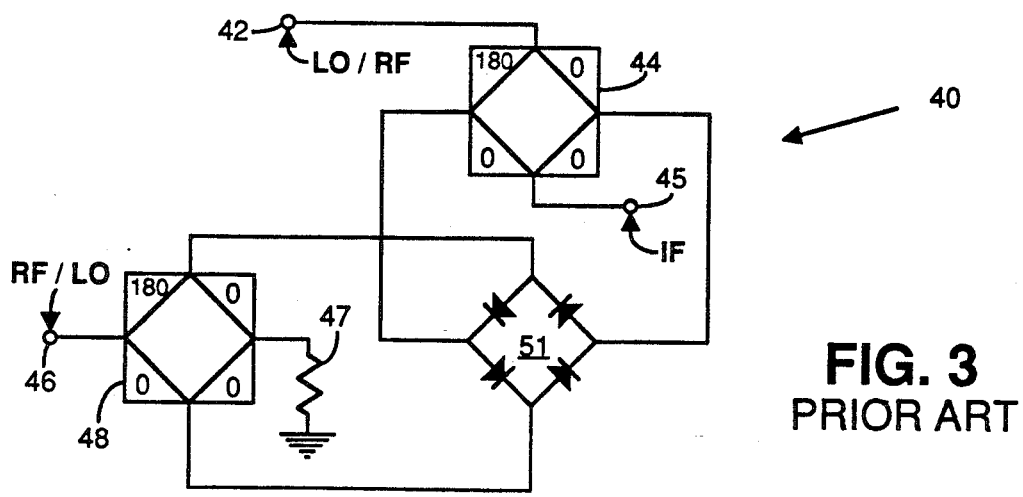
FIG. 3 is a simplified schematic representation of a mixer element used in the circuit of FIG. 2, according to the prior art.

Signals 71, 72 each have IF1', IF2' components having the relative phase indicated in Table I. When signals 71, 72 are passed through quadrature phase shifter 80, the various IF1', IF2' components add to reinforce or cancel according to the total relative phase difference that has been created in mixer 50. When IF1', IF2' are combined in phase shifter 80, all of the IF1 signals are out of phase at port 81 (cumulative $\Delta\phi=180°$) and in phase at port 82 (cumulative $\Delta\phi=0°$), and conversely for IF2 signals. Thus, separation of the IF1, IF2 signals is achieved. Further, such separation is achieved using only one four port mixer element 70 and substantially fewer overall components as compared to the prior art arrangements of FIGS. 2–3. Further, strip line or other large area components need not be used (although they are not precluded) and most or all of the various elements can be implemented as relatively compact lumped elements compatible with MMIC's.

Figure 5:
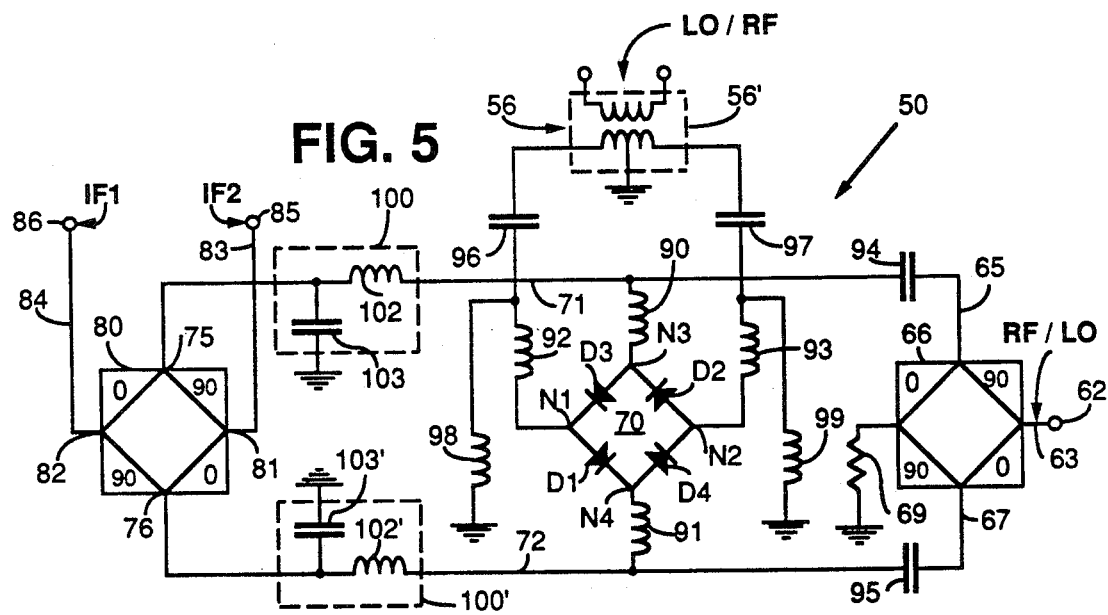
FIG. 5 is a schematic representation of the image separation mixer apparatus of FIG. 4 in greater detail.

FIG. 5 shows apparatus 50' analogous to apparatus 50 of FIG. 4, but in more detail. Similar elements are marked with the same reference numbers.

Circuit 50' comprises mixer element 70 and phase shift means 56, 66 and 80, where the use of balun 56' for phase shift means 56, is illustrated While use of balun 56' is convenient, other 180° phase shift means may also be used. Circuit 50' functions in the same manner as described for circuit 50 of FIG. 4, but with the addition of further elements that provide for DC blocking, DC return and improved high frequency impedance matching and filtering.

Impedances 90–93, e.g., inductors, are coupled in the signal lines leading to mixer nodes N1–N4 to enhance impedance matching to mixer element 70. Capacitors 94–97 are desirably provided for DC blocking to DC isolate mixer element 70 from input phase shift means 56, 66 as well as providing terminations for the IF signals. Inductors 98, 99 provide a DC return path between mixer element 70 and ground. Whether or not some or all of capacitors 94–97 and/or inductors 98, 99 are needed depends upon the nature of the input phase shift means.

Those of skill in the art will understand based on the description herein how to choose whether some or all of elements 91–99 are needed and the appropriate component values depending upon the particular RF, LO and IF frequencies and the choice of mixer and phase shift elements intended to be used.

Filter means 100, 100' having pass bands at the IF frequency and stop bands at the RF and/or LO frequencies are desirably provided between mixer element 70 and output quadrature phase shift means 80. A simple but effective filter comprises series inductor 102, 102' and shunt capacitor 103, 103', but other filter arrangements well known in the art may be used. It is important that filters 100, 100' have the same net phase shift for the IF frequencies being coupled from mixer element 70 to phase shift means 80 so that minimal relative phase shift is introduced thereby. Filters 100, 100' are desirably identical.

Figure 6:
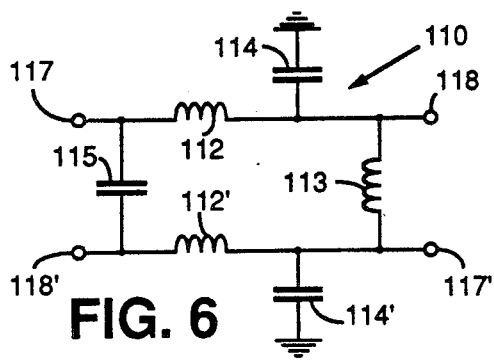
FIGS. 6 and 7 are simplified schematic representations of phase shift means suitable for use in the present invention.
Figure 7:
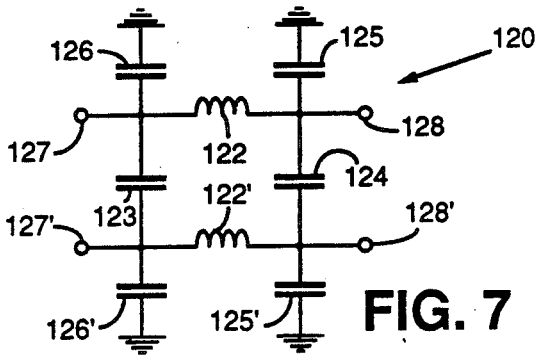

FIG. 6 shows a simplified schematic of a four port 180° relative phase shift means suitable for use in the present invention. FIG. 7 shows a simplified schematic of a four port 90° relative phase shift means suitable for use in the present invention. Such phase shift means are described in more detail in U.S. Pat. Nos. 4,992,761 and 4,893,098 and in copending application Ser. No. 445,307 to the same assignee, which are incorporated herein by reference.

Referring to FIG. 6, 180° relative phase shift element 110 has inductors 112, 112' and 113 and capacitors 114, 114' and 115 arranged as shown and coupled to inputs (or outputs) 117, 117' and outputs (or inputs) 118, 118'. Referring to FIG. 7, 90° relative phase shift element 120 has inductors 122, 122' and capacitors 123, 124, 125, 125', 126, 126' connected as shown and coupled to inputs (or outputs) 127, 127' and outputs (or inputs) 128, 128'. Those of skill in the art will understand how to select the magnitude of components 112–115 and/or components 122–126 based on the desired frequency response and impedances needed for the particular application, according to procedures well known in the art.

Inductors, capacitors and resistors such as are illustrated in FIGS. 4–7 may be readily fabricated using IC process techniques in a manner compatible with MMIC's. For example, resistors are formed from polycrystalline or single crystal semiconductor regions of various doping or using thin film materials, as for example, NiCr, TiW, TaN, and the like. Capacitors are formed using metal layers or semiconductor layers or a combination thereof spaced apart by dielectrics otherwise available during IC fabrication, as for example, $SiO$, $SiO_2$, $Si_3N_4$ or combinations thereof. Inductors are formed using metal regions of spiral shape and/or other geometries well known in the art. Al, Au and TiW are non-limiting examples of metals commonly used for conductors in IC's. Means and methods for fabricating such conductor, resistor, capacitor and/or inductor elements using the same techniques employed in IC fabrication are well known in the art.

Based on the foregoing description, it will be apparent to those of skill in the art that the present invention provides an improved means and method for an image separation mixer which employs comparatively few components, does not require strip lines and which employs lumped components most or all of which are readily fabricated on and/or in MMIC's with IC compatible technology.

While the present invention has been described in terms of particular arrangements, elements and methods, these are for convenience of explanation and not intended to be limiting. As those of skill in the art will understand based on the description herein, the present invention applies to other arrangements, choices of materials and elements and other methods which accomplish substantially the same result in substantially the same way, and it is intended to include in the claims that follow, these and other variations as will occur to those of skill in the art based on the present disclosure.

What is claimed is:

1. An image separating mixer apparatus comprising:
   first phase shift means for receiving a first input signal of at least a first frequency and providing second and third output signals of substantially equal amplitude and having a phase difference of substantially ninety degrees;
   second phase shift means for receiving a fourth input signal of at least a second frequency and providing fifth and sixth output signals of substantially equal amplitude and having a phase difference of substantially one hundred and eighty degrees;
   single four port mixer means for mixing the output signals from the first and second phase shift means to provide seventh and eighth signals of a third frequency derived from the first and second frequencies; and
   quadrature third phase shift means coupled to the mixer means for receiving the seventh and eighth signals and providing ninth and tenth output signals IF1, IF2 corresponding, respectively, to separated third and fourth frequencies RF1, RF2 forming the first signal or the fourth signal.

2. The apparatus of claim 1 wherein the mixer means comprises a balanced mixer.

3. The apparatus of claim 2 wherein the mixer means comprises a four port diode ring.

4. The apparatus of claim 1 wherein the second phase shift means comprises a balun.

5. The apparatus of claim 1 further comprising filter means coupling the mixer means to the quadrature phase shift means.

6. The apparatus of claim 5 wherein the filter means has a pass-band including the third frequency and a stop band including the first or fourth frequencies or both.

7. The apparatus of claim 6 wherein the filter means comprises a first filter means for passing the seventh signal and a second filter means for passing the eighth signal.

8. The apparatus of claim 1 further comprising at least one DC current path coupled between a port of the mixer means and ground.

9. The apparatus of claim 1 wherein first and second DC current paths are coupled between ground and opposed ports of the mixer means.

10. A method for mixing an RF signal including first and second RF frequencies RF1, RF2 with a LO signal to produce an IF signal having separated components IF1, IF2 corresponding to RF1, RF2, respectively, comprising:
    coupling the LO (or RF) signal to a first phase shift means which provides substantially equal amplitude LO (or RF) signal outputs differing in phase by substantially 180°;
    coupling the RF (or LO) signal to a second phase shift means having substantially equal amplitude RF (or LO) signal outputs differing in phase by substantially 90°;
    supplying the output signals of the first phase shift means to first opposed ports of a four port mixer element and the output signals of the second phase shift means to second opposed ports of the four port mixer element; and
    coupling IF signals appearing at opposed ports of the four port mixer element to input first and second ports of a four port quadrature phase shift means thereby obtaining at output third and fourth ports thereof separated IF signals IF1, IF2 corresponding to RF1, RF2, respectively.

11. The method of claim 10 wherein the supplying step comprises using a balanced mixer for the four port mixer element.

12. The method of claim 11 wherein the supplying step comprises using a four port diode ring mixer for the four port balanced mixer element.

13. The method of claim 10 further comprising coupling the IF signals from the mixer element to the quadrature phase shift means through filters which have pass bands including the IF frequency and stop bands including the RF or LO frequencies or both.

14. The method of claim 10 further comprising providing at least one DC current path coupled between a port of the mixer element and ground.

15. The method of claim 10 further comprising providing at least first and second DC current paths coupled between ground and opposed ports of the mixer element.

16. An image separating mixer apparatus comprising:
first quadrature phase shifter for receiving a first RF input signal including first and second RF frequencies RF1, RF2 and providing second and third output signals of substantially equal amplitude and having a phase difference of substantially ninety degrees;
second phase shifter for receiving a LO signal of a second frequency and providing fifth and sixth output signals of substantially equal amplitude and having a phase difference of substantially one hundred and eighty degrees;
four port diode ring mixer for mixing the output signals from the first and second phase shifters to provide seventh and eighth signals of an IF frequency derived from the first and second frequencies; and
quadrature third phase shifter coupled to the mixer for receiving the seventh and eighth signals and providing ninth and tenth output signals IF1, IF2 corresponding, respectively, to the first and second RF frequencies RF1, RF2.

17. The apparatus of claim 16 further comprising filter means coupling the mixer to the quadrature third phase shift means.

18. The apparatus of claim 17 wherein the filter means has a pass-band including the IF frequency and a stop band including the RF1, RF2 frequencies or both.

19. The apparatus of claim 18 wherein the filter means comprises a first filter means for passing the IF1 signal and a second filter means for passing the IF2 signal.

20. The apparatus of claim 16 further comprising first and second DC current paths coupled between ground and opposed ports of the mixer.

* * * * *